United States Patent [19]

Ray

[11] Patent Number: 4,510,172
[45] Date of Patent: Apr. 9, 1985

[54] TECHNIQUE FOR THIN INSULATOR GROWTH

[75] Inventor: Asit K. Ray, Yorktown Heights, N.Y.

[73] Assignee: International Business Machines Corporation, Armonk, N.Y.

[21] Appl. No.: 614,177

[22] Filed: May 29, 1984

[51] Int. Cl.³ ............................................. B05D 3/06
[52] U.S. Cl. ........................................ 427/38; 427/93; 427/94
[58] Field of Search ..................... 427/38, 39, 93, 94

[56] References Cited

U.S. PATENT DOCUMENTS

| | | | |
|---|---|---|---|
| 3,647,535 | 3/1972 | Naber | 427/93 |
| 4,178,877 | 12/1979 | Kudo | 427/38 |
| 4,232,057 | 11/1980 | Ray | 427/39 |
| 4,323,589 | 4/1982 | Ray et al. | 427/93 |

Primary Examiner—John H. Newsome
Attorney, Agent, or Firm—Thomas J. Kilgannon

[57] ABSTRACT

This invention relates to a process for forming thin insulator films on conductive or semiconductive substrates in a gas plasma and more particularly relates to a process for the growth of such thin insulating films wherein the rate of insulator growth on one surface of a substrate is controlled by predepositing specific amounts of insulating films such as silicon dioxide or silicon nitride on the other surface of the substrate. Substrates with predeposited insulators form insulating films much more slowly in a gas plasma than bare substrates and, after an initial fast growth phase, the insulator thickness reaches a steady growth phase. Because of the resulting slower rate of insulator formation, control of the desired insulator thickness is easy and it is even easier if the desired insulator thickness is close to the steady growth phase.

20 Claims, 2 Drawing Figures

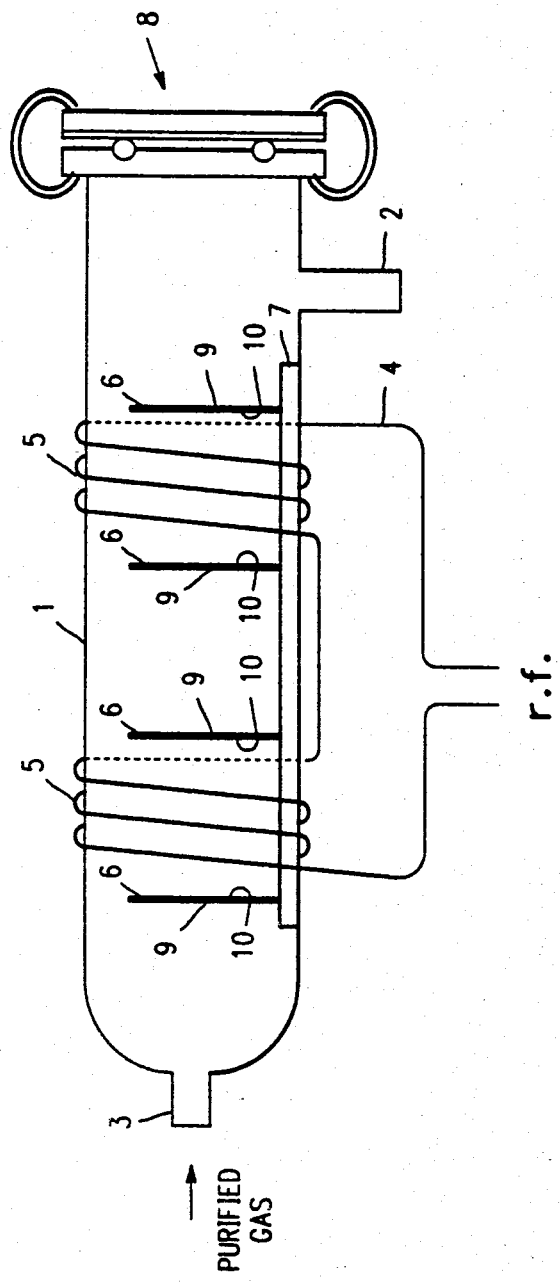

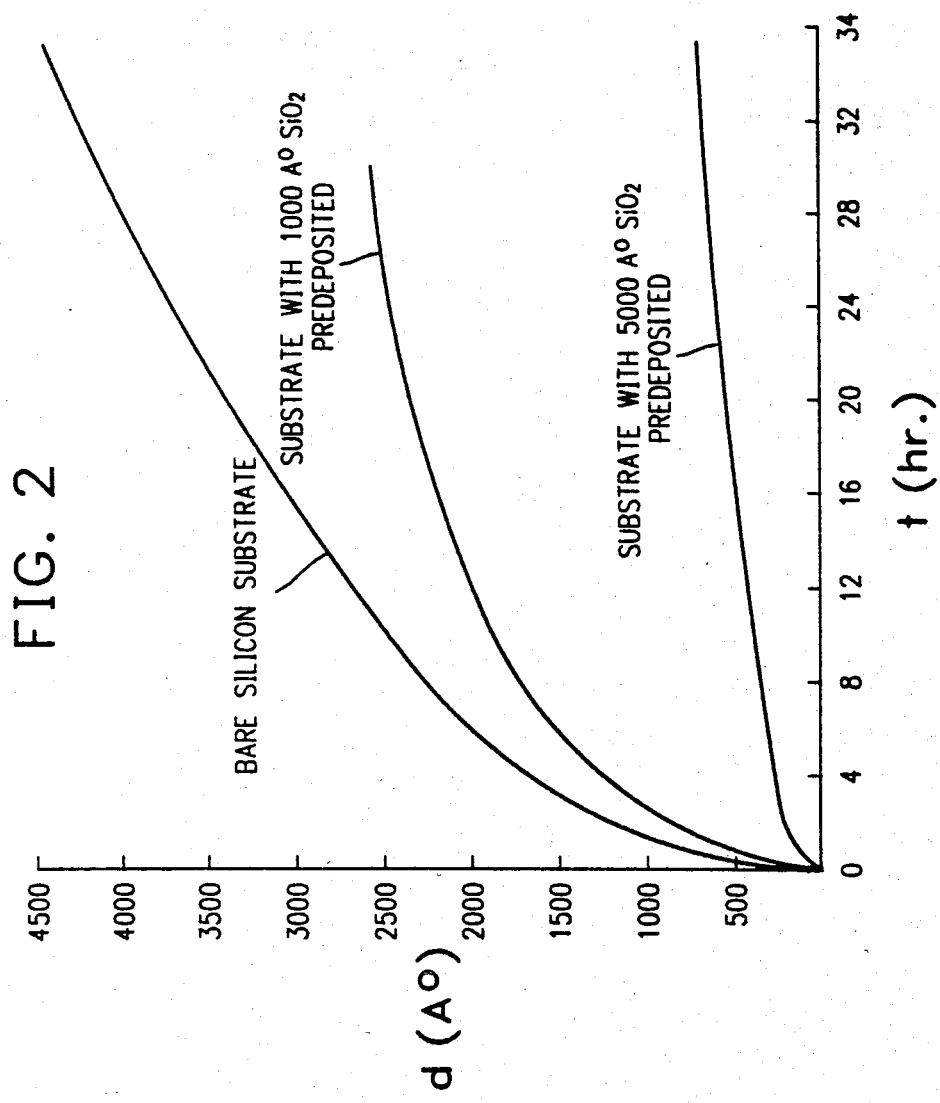

TECHNIQUE FOR THIN INSULATOR GROWTH

DESCRIPTION

1. Technical Field

This invention relates to a process for forming thin insulator films on conductive or semiconductive substrates in a gas plasma and more particularly relates to a process for the growth of such thin insulating films wherein the rate of insulator growth on one surface of a substrate is controlled by predepositing specific amounts of insulating films such as silicon dioxide or silicon nitride on the other surface of the substrate. Substrates with predeposited insulators form insulating films much more slowly in a gas plasma than bare substrates and, after an initial fast growth phase, the insulator thickness reaches a steady growth phase. Because of the resulting slower rate of insulator formation, control of the desired insulator thickness is easy and it is even easier if the desired insulator thickness is close to the steady growth phase.

2. Background Art

In semiconductor device applications, particularly in the fabrication of field effect transistor devices, thin silicon dioxide films in the order of 100–500Å in thickness are needed. Conventionally, these films are formed by placing silicon substrates at high temperatures (900°–1000° C.) in an oxygen containing ambient. At these high temperatures and in the thickness ranges mentioned, the oxide thickness increases rapidly and linearly with time. For example, it takes only eight minutes to grow 100Å silicon dioxide films on silicon substrates at a temperature of 1000° C. In order to control oxide thickness, the time and temperature of the oxidation process has to be precisely controlled. Loading and unloading of silicon substrates from the hot zone of an oxidation furnace takes a certain amount of time and it is often not controllable. As a result, the oxide thickness can vary from run-to-run.

U.S. Pat. No. 4,323,589, filed May 7, 1980 and assigned to the same assignee as the present invention, is directed to a plasma oxidation method wherein oxidation of the surface of the substrate which does not face toward the plasma is achieved by placing the substrate perpendicular to the plasma in a region at a pressure greater than 10 mTorr. The process of the reference results in the formation on the reverse side (i.e., that surface not facing towards the plasma) of oxides with properties substantially equivalent to oxides which are grown thermally. However, the temperature to which the substrate must be subjected is much less than that used for thermally grown oxide. This is advantageous since oxidation at high temperatures, particularly when the substrate is doped, tend to cause redistribution or depletion of the dopants. In this process, however, the oxidizing surface oxidizes at a rate comparable to the conventional thermal oxidation process. Because of this, in the plasma environment, growth rates in the 100–500Å range are not precisely controlled on bare silicon substrates.

It is, therefore, a principle object of this invention to provide a process for forming insulator films on the surface of a conductive or semiconductive substrate wherein the thickness of the insulator being formed is precisely controllable.

It is another object of this invention to provide an oxidation process for conductive and semiconductive substrates wherein the rate of oxide formation is precisely controllable in the range of 100–500Å.

Yet another object is to provide a process in which oxide, nitride, oxynitride and carbide insulator films are formed on the surface of semiconductor or conductive substrates by predepositing a desired insulator at a controlled thickness on the side of the substrate opposite to the side being subjected to a gas plasma insulator formation step.

BRIEF SUMMARY OF THE INVENTION

The present invention relates to a process for forming thin insulator films on conductive or semiconductive substrates in a gas plasma after the substrates have been subjected to an insulator predeposition step which forms an insulator of a given thickness on a surface which will not be subjected to a final plasma thin insulator formation step. Broadly speaking, as greater thicknesses of insulator are preformed, the rate of insulator formation on the other surface of the substrate decreases when it is subjected to a subsequent plasma insulator formation step. This approach provides particularly attractive results when it is desired to form oxides having thicknesses in the range of 100Å and greater on the surface of a silicon substrate. It has been found that for each thickness of a predeposited insulator film, a steady growth phase of the insulator film thickness is reached. As a consequence, by increasing the thickness of a predeposited film, the steady growth phase of film thickness is also reduced and films of thickness of 50Å and less which are suitable for tunnelling applications can be obtained. The process can be utilized for forming insulating films like oxides, nitrides, oxynitrides and carbides on substrates of semiconductors like silicon and gallium arsenide and on conductive substrates like aluminum.

These and other objects, features and advantages will be more apparent from the following more particular description of the preferred embodiments.

BRIEF DESCRIPTION OF THE DRAWINGS

FIG. 1 is a partially schematic, cross-sectional view of plasma oxidation apparatus used in the practice of the present invention. In the apparatus shown, a plurality of preoxidized substrates are subjected to a plasma oxidation process wherein the rate of formation of oxide is precisely controlled.

FIG. 2 is a graph of the variation of oxide thickness with time for a bare silicon substrate and for silicon substrates with two different amounts of predeposited silicon dioxide films on one side thereof. In the graph, the rate of change of oxide formation generally decreases with increasing thickness of predeposited oxide.

DESCRIPTION OF A PREFERRED EMBODIMENT

Referring now to FIG. 1, there is shown a schematic diagram of plasma apparatus suitable for carrying out the process of the present invention. In FIG. 1, a nonreactive container 1 made of quartz includes a conduit 2 by means of which container 1 is evacuated when conduit 2 is connected to any well-known vacuum pump. Another conduit 3 disposed coaxially with the longitudinal axis of container 1 is used to admit a purified gas such as oxygen, nitrogen or ammonia into container 1. Other gases, such as mixtures of oxygen and nitrogen or oxygen and ammonia to form oxynitrides and methane and other hydrocarbon gases to form carbides, may also be used without departing from the spirit of the present invention. In a preferred embodiment, a controlled amount of oxygen regulated by a mass flow meter (not shown) is introduced into container 1 at a controlled pressure. The oxygen is preferably of ultra-high purity (e.g., 99.99% $O_2$) and is further purified by being heated in an oven (not shown) to a temperature in the range of 900°–1100° C. to decompose any hydrocarbons which might be present into carbon dioxide and water. These components are removed from the oxygen in a well-known manner by means of a liquid nitrogen trap (not shown). The thus purified oxygen is introduced into container 1 via conduit 3 at a pressure in the range of 15–100 mTorr and preferably at 20 mTorr. An oxygen plasma is generated for the growth of thin oxide films by means of a coil 4 connected to a variable frequency r.f. generator (0.5–8 MHz). Induction coil 4 includes two sections 5 which are connected in series. Coil 4 is made of $\frac{1}{4}''$ copper tubing. The number of turns in each section 5 can be between two and four.

The temperature of a substrate during plasma oxidation is usually in the range of 300°–550° C. and preferably about 340°–525° C. Substrate temperature may be independently controlled in the same manner as shown in the aforementioned U.S. Pat. No. 4,323,589 which is hereby incorporated by reference.

In FIG. 1, four conductive or semiconductive substrates 6 mounted on an insulating substrate holder 7 are introduced into container 1 via a port 8 which can be sealed to permit evacuation and subsequent introduction of purified oxygen. Substrates 6, preferably silicon wafers, are arranged within container 1 such that coil sections 5 are disposed between pairs of substrates 6. When the desired oxygen pressure (20 mTorr) is reached, r.f. power is applied and a plasma is struck between each pair of substrates 6 with a dark space between the pairs. Typical applied r.f. power is approximately 1 to 4 kW and is preferably about 1.5 kW. Under such circumstances, the surfaces on which the oxide insulating film forms are the surfaces 9 of substrates 6 facing away from coil sections 5 and silicon dioxide is formed on surfaces 9 in accordance with the curve entitled "Bare Silicon Substrate" shown in the graph of FIG. 2.

FIG. 2 is a graph of the variation of oxide film thickness versus time which shows the rates at which silicon dioxide is formed in the gas plasma environment for a "Bare Silicon Substrate", "A Substrate With 1000Å of $SiO_2$ Predeposited" and for a "Substrate With 5000Å of $SiO_2$ Predeposited." Considering first the curve in FIG. 2 entitled "Bare Silicon Substrate", it should be noted that very high deposition rates are encountered in the first few hours of oxide deposition. As previously indicated, relatively large amounts of oxide can be formed in a few minutes resulting in a situation where even small variations in plasma generation time can result in rather large variations in the thickness of the oxide being formed.

As can be further seen from a consideration of the curve "Bare Silicon Substrate", the rate of deposition is so high that if one wished to deposit oxide thicknesses of 50Å and below consistently, it would be practically impossible to achieve such control from run-to-run. The present invention solves the problem of high deposition rates by predepositing an oxide or other insulator film on the surfaces 10 of substrates 6 which face the plasma. In other words, oxide or other insulator films of a given thickness are preformed on surfaces 10 of substrates 6 prior to being introduced into the apparatus of FIG. 1. Then, when r.f. power is applied and the plasma struck, plasma oxidation occurs on surfaces 9 of substrates 6 at a rate depending on the thickness of the predeposited oxide or other insulator film.

Referring again to FIG. 2, two curves entitled "Substrate With 1000Å $SiO_2$ Predeposited" and "Substrate with 5000Å $SiO_2$ Predeposited" are shown. A consideration of these curves shows that the greater the thickness of the predeposited oxide, the smaller is the formation rate of oxide film formed in the apparatus of FIG. 1. It should be noted that while early deposition rates for a substrate with 1000Å of predeposited silicon dioxide is still rather high, the deposition rate for a substrate with 5000Å of predeposited silicon dioxide falls off rather sharply. Under the last mentioned conditions, it should be clear that deposition rates have been controlled in such a way that controllable thicknesses of oxide can be achieved on a run-to-run basis. It should be apparent from FIG. 2 that controllable deposition rates are obtainable over a wide range of predeposited oxide thicknesses. To the extent that the oxide thickness approaches a rather steady growth phase, control of the thickness of the plasma formed films becomes extremely easy. Because deposition rates are very low at higher thicknesses of predeposited oxide, the plasma oxidation process is now highly controllable and is particularly advantageous in those regimes where thin tunnelling oxides are being formed and must not vary appreciably from run-to-run.

In connection with the step of predepositing controlled amounts of oxide on the surface of a substrate, any well-known technique can be used to form the predeposited layer. Thus, chemical vapor deposition, sputtering or thermal oxidation may be used prior to introducing the substrates into the plasma oxidation environment. In addition to silicon oxide, nitrides such as silicon nitride, carbides such as silicon carbide and oxynitrides such as silicon oxynitride may also be used as predeposited insulators. These films can be formed by well-known techniques such as CVD, sputtering or evaporation. These films may also be formed in the apparatus of FIG. 1 using an appropriate gas plasma. At this point, it should be appreciated that the formation of the predeposited films and the thin insulator films are not dependent in any way on the types of insulators used for these films. Thus, an oxide film may be deposited using silicon nitride as the predeposited film and vice versa.

Turning now to FIG. 1, it should be appreciated that the film formation rate on substrates 6 may be fine tuned by adjusting the distance of substrates 6 from coils 5. This can usually be accomplished by moving wafers 6 into slots (not shown) formed in substrate holder 7. Using this adjustment, the substrate-to-substrate film thickness uniformity can be controlled to better than ±5%.

The process of the present invention is applicable to the treatment of metallic-type electrically conductive substrates and semiconductive substrates. The metallic-type electrically conductive substrate can be an electrically conductive metal, mixtures of electrically conductive metals, electrically conductive metallic alloys as well as non-metallic materials such as highly doped polycrystalline silicon or intermetallic silicides which have electrically conductivity of the same order as metals.

The present invention also contemplates the treatment of substrates containing semiconductive materials such as silicon, polycrystalline silicon and gallium arsenide. The semiconductors may be doped or undoped.

Having thus described my invention, what I claim as new, and desire to secure by Letters Patent is:

1. A method for controlling the thickness of plasma formed insulators on the surface of a substrate having first and second surfaces comprising the step of:
   forming a first insulator layer on said first surface of said substrate said first layer having a predetermined thickness,
   depositing on said second surface from a gas plasma a second insulator layer the thickness of which for a given time period decreases as said predetermined thickness of said first layer increases.
2. A method according to claim 1 wherein said substrate is a semiconductor material.
3. A method according to claim 1 wherein said substrate is a conductive material.
4. A method according to claim 1 wherein the step of forming a first insulator layer includes the step of depositing said first insulator layer by chemical vapor deposition.
5. A method according to claim 1 wherein the step of forming a first insulator layer includes the step of depositing said first insulator layer by gas plasma deposition.
6. A method according to claim 1 wherein the step of forming a first insulator layer includes the step of thermally forming said first insulator layer.
7. A method according to claim 1 wherein the step of forming a first insulator layer includes the step of depositing said first insulator layer by sputtering.
8. A method according to claim 1 wherein the step of forming a first insulator layer includes the step of depositing said first insulator layer by evaporation.
9. A method according to claim 1 wherein the step of of depositing from a gas plasma includes the steps of placing said substrate in a gas plasma forming apparatus such that said substrate is disposed perpendicularly to the flow of plasma gas and the pressure of said plasma gas is in the range of 15–100 mTorr, striking a plasma such that a glow is formed adjacent said first surface thereby forming said second insulator layer.
10. A method according to claim 1 wherein said gas plasma is formed from a plasma gas of oxygen, said substrate is silicon and said second insulator layer is silicon oxide.
11. A method according to claim 1 wherein said gas plasma is formed from a plasma gas which includes nitrogen, said substrate is silicon and said second insulator layer is silicon nitride.
12. A method according to claim 1 wherein said gas plasma is formed from a plasma gas which includes carbon, said substrate is silicon and said second insulator layer is silicon carbide.
13. A method according to claim 1 wherein said gas plasma is formed from a plasma gas which includes oxygen and nitrogen, said substrate is silicon and said second insulator layer is silicon oxynitride.
14. A method according to claim 1 wherein said first and second insulator layers are made of the same insulators.
15. A method according to claim 1 wherein said first and second insulator layers are made of different insulators.
16. A method according to claim 14 wherein said first and second insulator layers are oxides.
17. A method according to claim 14 wherein said first and second insulator layers are nitrides or oxynitrides.
18. A method according to claim 14 wherein said first and second insulator layers are carbides.
19. A method according to claim 15 wherein said first insulator layer is an oxide and said second insulator layer is a nitride.
20. A method according to claim 15 wherein said first insulator layer is a nitride and said second insulator layer is an oxide.

* * * * *